(12) United States Patent
Helleday (10) Patent No.: US 10,524,359 B2
(45) Date of Patent: Dec. 31, 2019

(54) METHOD AND SYSTEM FOR MANUFACTURING A WORKPIECE USING A POLYMER LAYER

(71) Applicant: Mycronic AB, Taby (SE)

(72) Inventor: Robert Helleday, Stockholm (SE)

(73) Assignee: Mycronic AB, Taby (SE)

( * ) Notice: Subject to any disclaimer, the term of this patent is extended or adjusted under 35 U.S.C. 154(b) by 0 days.

(21) Appl. No.: 15/781,169

(22) PCT Filed: Oct. 18, 2016

(86) PCT No.: PCT/EP2016/074943
§ 371 (c)(1),
(2) Date: Jun. 4, 2018

(87) PCT Pub. No.: WO2017/092923
PCT Pub. Date: Jun. 8, 2017

(65) Prior Publication Data
US 2018/0359857 A1 Dec. 13, 2018

(30) Foreign Application Priority Data

Dec. 3, 2015 (SE) ...................................... 1500497

(51) Int. Cl.
*H05K 1/16* (2006.01)
*H05K 3/32* (2006.01)

(52) U.S. Cl.
CPC ............. *H05K 1/162* (2013.01); *H05K 1/165* (2013.01); *H05K 1/167* (2013.01); *H05K 3/321* (2013.01);
(Continued)

(58) Field of Classification Search
CPC ..... H05K 2203/1142; H05K 2203/107; H05K 2201/0329
(Continued)

(56) References Cited

U.S. PATENT DOCUMENTS 5,427,841 A * 6/1995 De Leeuw ........... C08G 61/126
428/209
5,620,800 A * 4/1997 De Leeuw ........... C08G 61/126
156/150
(Continued)

FOREIGN PATENT DOCUMENTS

EP 0615256 A2 9/1994
KR 2003-0044562 A 6/2003

OTHER PUBLICATIONS

International Search Report PCT/ISA/210 for PCT/EP2016/074943 dated Jan. 20, 2017.
(Continued)

*Primary Examiner* — Sherman Ng
(74) *Attorney, Agent, or Firm* — Harness, Dickey & Pierce, P.L.C.

(57) ABSTRACT

A method and system for manufacturing a workpiece is disclosed. The method comprises providing (810) a layer (120) of a polymeric material on at least a portion of a substrate (110) and patterning (830) the layer of polymeric material by exposing the layer with electromagnetic radiation having a frequency and amplitude within said certain frequency range and amplitude range so as to form a pattern of regions (122) having a first electrical conductivity and regions (124) having a second electrical conductivity. The method further includes the actions of mounting (840) an electronic component (140) on the layer of polymeric material and curing (850) the polymeric material. A workpiece comprising a substrate (110), a layer (120) of a polymeric material adapted to, in a non-cured state, to change its electrical conductivity when exposed with electromagnetic radiation (E) within a certain frequency and amplitude range is also disclosed.

19 Claims, 8 Drawing Sheets

(52) U.S. Cl.
CPC ............... *H05K 2201/0329* (2013.01); *H05K 2203/107* (2013.01); *H05K 2203/1142* (2013.01)

(58) Field of Classification Search
USPC ............................... 174/255, 257, 258, 260
See application file for complete search history.

(56) References Cited

U.S. PATENT DOCUMENTS

| | | | |
|---|---|---|---|
| 2007/0012773 A1* | 1/2007 | Mickle | G06K 19/07745 235/435 |
| 2008/0241549 A1 | 10/2008 | Seon et al. | |
| 2008/0264682 A1 | 10/2008 | Catron et al. | |
| 2009/0068340 A1 | 3/2009 | Junghans et al. | |
| 2009/0272560 A1* | 11/2009 | Tokunaga | H05K 3/106 174/126.1 |
| 2013/0098668 A1* | 4/2013 | Kim | G06F 3/044 174/257 |
| 2013/0295354 A1* | 11/2013 | Guntermann | H01B 1/127 428/212 |
| 2014/0185244 A1* | 7/2014 | Lee | H05K 1/0209 361/709 |
| 2014/0202742 A1 | 7/2014 | Jones et al. | |
| 2014/0290988 A1* | 10/2014 | Spath | H05K 1/09 174/254 |
| 2014/0308616 A1* | 10/2014 | Yang | H05K 3/067 430/297 |
| 2014/0319381 A1 | 10/2014 | Gross | |

OTHER PUBLICATIONS

Written Opinion of the International Searching Authority PCT/ISA/237 for PCT/EP2016/074943 dated Jan. 20, 2017.

\* cited by examiner

METHOD AND SYSTEM FOR MANUFACTURING A WORKPIECE USING A POLYMER LAYER

CROSS-REFERENCE TO RELATED APPLICATIONS

This is a national phase under 35 U.S.C. § 120 to, PCT International Application No. PCT/EP2016/074943, which has an international filing date of Oct. 18, 2016 which claims priority to Swedish Patent Application No. 1500497-1, filed Dec. 3, 2015 the entire contents of each of which are hereby incorporated by reference.

TECHNICAL FIELD

The present invention relates to a method for manufacturing a workpiece, and in particular a workpiece wherein electronic components are attached to a substrate by means of a patterned layer of a polymeric material. The present invention also relates to such a workpiece.

BACKGROUND

Surface Mount Technology (SMT) is a method wherein electronic components are mounted or placed onto a surface of a printed wiring board (PWB) so as to form a printed circuit board assembly. The electronic components may be electrically and mechanically connected to electric contact pads of the PWB by means of e.g. a solder joint formed of reflowed solder paste. Conventionally, the solder paste may be provided on the PWB in the form of deposits that are screen printed onto the contact pads.

Today, there is a growing interest in smaller electronic components, more densely packed printed circuit board assemblies, higher volumes and higher throughput. Thus, there is a need for improved workpieces and methods for mounting electronic components onto a substrate.

SUMMARY

It is an object of the present invention to provide an improved method for manufacturing a workpiece comprising a substrate having electrically conductive regions and mounted electronic components. Accordingly, the invention provides a manufacturing method and a workpiece having the features set forth in the independent claims. Advantageous embodiments of the invention are defined by the dependent claims.

Hence, according to a first aspect a manufacturing method is provided wherein a layer or coating of a polymeric material is provided on at least a portion of a substrate. The polymeric material is capable of changing its electrical conductivity upon exposure to electromagnetic radiation. In the method, the layer of polymeric material is exposed with electromagnetic radiation so as to form a pattern of regions of different electrical conductivity. In a further step an electronic component is mounted on the layer of polymeric material and the polymeric material is cured.

According to a second aspect, a workpiece is provided comprising a substrate and an electronic component attached to the substrate by means of a layer of a polymeric material that is patterned according to the method of the first aspect.

The change in electrical conductivity may e.g. be induced, or at least be more substantial, at certain frequencies and amplitudes of the electromagnetic radiation. In one example, ultraviolet light may be used to modify the conductivity. The electrical conductivity of the polymeric material may deteriorate upon exposure to electromagnetic radiation having a frequency and amplitude within certain ranges. However, it will be appreciated that the electrical conductivity in other examples may increase as the polymeric material is exposed to a certain type of electromagnetic radiation.

The present aspects are based on the realization that a patterned layer with regions having a first conductivity and regions having a second conductivity may be formed without selective deposition and/or removal of material of the layer. Instead, electromagnetic radiation, such as e.g. light, may be utilized to define electrically conductive patterns and structures directly in the layer of polymeric material. Preferably, patterning techniques known from e.g. photolithography may be used when exposing the polymeric material to a desired pattern. Such techniques may e.g. include the use of photo masks and direct printing. The use of light (or electromagnetic radiation) allows for relatively fine pitch structures and features of the pattern to be defined, in particular as compared with prior art methods involving selective deposition of material, involving e.g. printing and plating and selective removal of material, involving e.g. etching. Further, by forming the pattern in the layer of polymeric material by changing the electrical conductivity of the polymeric material, regions having different electrical conductivity may be provided in the same, possibly continuous, layer. The initially provided layer of polymeric material may hence be kept intact in terms of its extension on the substrate, without any need for removal of material to form the pattern. By omitting steps relating to definition of a pattern by selective removal of material the manufacturing of the workpiece may be simplified and cheaper.

The polymeric material may e.g. be provided in the form of a liquid, a spray or a film, and may have adhesive properties allowing it to adhere to the surface of the substrate. The polymeric material may also be applied to the substrate by means of e.g. spin coating.

The curing of the polymeric material should be understood as a step of changing e.g. a mechanical or rheological characteristic of the polymeric material. In the curing the polymeric material may be hardened or toughened into a relatively solid layer that may be electrically and/or mechanically coupled to the substrate. The polymeric material may be described by a non-cured state and a cured state, wherein electrical conductivity preferably may be changed in the non-cured state rather than the cured state. In other words, the curing may result in the electric conductivity being fixed or at least less sensitive to exposure by electromagnetic radiation. Further, mechanical properties such as e.g. hardness, viscosity and elasticity may differ between the non-cured state and the cured state. In some examples, the curing may result in the polymeric material transiting from a liquid or viscous state to the solid state, or at least to a state having higher hardness, viscosity or being less elastic. Alternatively, or additionally, the polymeric material may, during curing, undergo a reduction in tackiness or stickiness. The curing may e.g. involve a chemical process, which may be induced by exposure to heat, electromagnetic radiation and/or chemical agents. In one example, a reflow oven of the same type as used in reflow of solder paste in prior art surface mount technology may be used. In other examples, the layer of polymeric material is cured by means of exposure to electron beams, microwaves or ultraviolet light.

The polymeric material may comprise a certain tackiness or stickiness allowing for the electronic component to adhere to the substrate during manufacturing and in particular during handling until curing of the polymeric material.

The polymeric material, and in particular the regions of the material to which the electric component is attached, may hence act as a glue or adhesive keeping the mounted component in the right position on the substrate. The tackiness may be adjusted in an additional processing step, such as e.g. a baking step. During curing, the polymeric material may be hardened or otherwise modified to provide a more fixed or permanent coupling between the electronic component and the substrate.

The electronic component may e.g. be arranged on the substrate such that an electric and/or mechanical coupling is established between the component and the substrate by means of the layer of polymeric material. The component may e.g. be arranged such that a contacting portion of the component contacts a region of the polymeric material having a first conductivity so as to form an electrical connection with the substrate. Further, the component may be attached to a region having a second, preferably lower electrical conductivity so as to e.g. provide a mechanical and/or thermal connection to the substrate.

The present aspects are advantageous in that they provide alternative methods of providing electrical structures and components on substrates. The pattern in the polymeric material may e.g. be used to define conductive tracks on printed wiring boards and other substrates for which electrical communication paths are required. Further, the polymeric material and its regions of different electrical conductivity may provide electrical, thermal and/or mechanical connection to other components. Examples of such connections may include electrical joints (e.g. replacing prior art solder joints), heat sinks and underfill. Other applications of the present aspects may concern electronic devices or printed circuits, wherein the regions of different electric conductivity may define circuits and electronic components, such as e.g. resistors, capacitors and inductors, which may be printed directly on the substrate.

Defining the pattern by means of electromagnetic radiation is advantageous in terms of resolution and pitch of the electrically conducting regions, as electromagnetic radiation may allow for a higher resolution and finer pitch as compared with e.g. screen printing of solder paste.

The polymeric material may be at least partly light transmitting or transparent, and in particular to light within a certain range of wavelengths. The ability to transmit light may be of particular interest in connection with e.g. photovoltaic applications, window panes and visual displays, wherein the patterned polymeric material may be used to define e.g. electric components or conductive tracks.

The end product of the method according to the first aspect and the workpiece according to the second aspect may be a finished printed circuit board assembly or circuit card assembly, i.e., a substrate (such as e.g. a printed wiring board comprising conductive pads) populated with electronic components. In one example, the majority of the electric components, or substantially all components, may be assembled in the method according to the present embodiment. Such a method may differ from a repair process wherein only one or a few components are repaired on, or added to, an already assembled circuit card assembly.

The term "conductive" may, in the context of the present application, refer to a capability of a region of the polymeric material to conduct or transmit a desired electrical power or signal, e.g. required for operation of an electronic component. The electrical power or signal may be transmitted in a direction parallel to the layer of polymeric material and/or in a direction substantially orthogonal to the layer. The first electrical conductivity may refer to such conductive regions, whereas the second electrical conductivity may refer to regions having reduced electric conductivity or even non-conductive regions, i.e., regions of the polymeric material not being able to transmit or convey such an electrical power or signal.

According to an embodiment, the polymeric material may be subjected to one or several baking steps in which the polymeric material may be exposed to e.g. heat. The baking step(s) may e.g. be performed to achieve a desired viscosity or tackiness suitable for subsequent processing steps (such as e.g. mounting of components). It should be noted that baking of the polymeric material differs from curing, as the baking e.g. may be performed at temperatures lower than those required for curing and/or during periods of time too short to cure the material.

According to an embodiment, the regions having a first electrical conductivity may be electrically separated from, or isolated from, each other by regions having a second electrical conductivity. The regions having a first electrical conductivity may e.g. form electrical contact areas or terminals, or conductive tracks for transmitting e.g. electric power or signals. By separating the regions having the first electrical conductivity from each other by means of intermediate regions having less electrical conductivity the risk for electric shortcuts, electromagnetic crosstalk and losses may be reduced.

According to an embodiment, the regions having a first electrical conductivity may be formed so as to provide electrical connection to conductive pads, tracks and other conductive structures or features of the substrate. The regions having a first electrical conductivity may e.g. be formed directly on a conductive structure of the substrate so as to provide a stacked electrical contact structure. The regions having a first electrical conductivity may be formed so as to provide electrical connections between electronic components to be mounted on the substrate in a subsequent mounting step, or the regions may even be formed as to provide electrical connections between the conductive pads, e.g. to form a conductive path for conducting a current between the conductive pads, where said conductive path is extending on the surface of the coated substrate in a same plane as the layer of polymeric material of the substrate, and where said substrate e.g. is a printed wiring board used by the technology disclosed for manufacturing a workpiece in form of a printed circuit board. Additionally, the regions having the first electrical conductivity may extend beyond or outside of the conductive structure of the substrate, seen in a lateral direction of the substrate, so as to provide an electrical contact that is located beside the conductive structure of the substrate. The electrical contact may e.g. form part of a joint connecting an electronic component to the substrate. In one example, the regions having a first electrical conductivity may provide a wiring extending between an electrical contacting portion of the layer and a conductive pad or track of the substrate.

According to some embodiments, the step of patterning the layer of polymeric material comprises exposing at least 50% of a total surface area of the layer of the polymeric material at the same time. Preferably, the entire surface or substantially entire surface area may be patterned simultaneously so as to reduce the cycle time of the patterning step. Such an exposure may e.g. be performed by means of a photo mask.

According to an embodiment, the step of patterning the layer of polymeric material comprises direct printing with e.g. laser.

According to an embodiment, the method further comprising forming an electronic device on the substrate. The electronic device may be defined by regions having different electrical conductivity so as to form e.g. capacitors, inductors and resistors having a desired electrical performance or property. The electronic device may have a main current path extending in a same plane as the layer of polymeric material or in a direction perpendicular to the layer of polymeric material. The electric properties or performance of such an electronic device may e.g. be determined by a thickness of the layer of polymeric material and/or the extent to which the polymeric material has been exposed.

Arranging the electronic device such that a current passes through the device in a direction orthogonal to the layer may be advantageous in terms of a reduced circuit area or footprint. Such an electronic device may e.g. be arranged between a mounted component and an underlying pad, thus having a footprint that at least partly overlaps with a footprint of the component. In one example, the electronic device forms a resistor extending between a surface of the layer of polymeric material and an underlying pad. The resistance of the resistor may e.g. be determined by the thickness of the layer of polymeric material and/or time and intensity of the exposure during the patterning of the layer.

According to an embodiment, the substrate may be a printed wiring board for providing mechanical support and/or electrically connect e.g. electronic components. The printed wiring board may e.g. comprise conductive tracks and contact portions (pads) arranged onto a non-conductive base of e.g. FR-4 glass epoxy. An assembled printed wiring board may be referred to as a printed circuit board assembly or circuit card assembly.

According to an embodiment, the polymeric material may be viscous when provided on the substrate. The polymeric material may in other words by applied to the substrate in a liquid state with a consistency allowing the polymeric material to form a layer that remains on the substrate during subsequent processing steps. The term viscous should be understood as having a relatively thick and possibly sticky consistency or having a relatively high viscosity.

According to some embodiments, the layer of polymeric material may be provided by means of spray coating or in the form of a film that is attached to the substrate.

According an embodiment, the layer of polymeric material may be provided so as to have a maximum thickness of 1 to 10.000 micrometers. The thickness of the polymeric layer may be varied so as to meet specific criteria regarding e.g. mechanical and electrical properties. A relatively thick layer may be advantageous in terms of mechanical attachment of e.g. electrical components, where a thicker layer may provide a better mechanical support for the components and/or their legs as compared to a thinner layer. On the other hand, a thinner layer may provide a reduced electrical resistance between the component and the substrate and be easier to bake and/or cure as compared to a thinner layer.

According to an embodiment, the layer of polymeric material may be provided so as to have a thickness that varies less than 5 micrometers as seen over the surface of the substrate. By reducing the variation in thickness, the mechanical and electrical performance of the layer may be improved in terms of reliability and predictability. Further, a relatively low variation in thickness (resulting in a relatively even and well defined surface) may facilitate subsequent processing of the substrate, such as e.g. mounting of components, measurements and/or curing.

According to an embodiment, the polymeric material is a conductive polymer, such as e.g. 3,4-ethylenedioxythiophene (PEDOT), or any derivative thereof. PEDOT is advantageous in that it is relatively optical transparent in its electrically conductive state. Optically transparent materials may be suitable for e.g. displays and solar cells.

According to certain aspects of the technology disclosed, a method is proposed where the step of mounting an electronic component on the layer of polymeric material is omitted, said method is defined by the following steps for manufacturing a workpiece (100):

providing (810) a layer (120) of a polymeric material on at least a major portion of the surface of a substrate (110), said polymeric material being adapted to change its electrical conductivity when exposed with electromagnetic radiation (E) within a certain frequency range and certain amplitude range;

patterning (830) the layer of polymeric material by exposing the layer with electromagnetic radiation having a frequency and amplitude within said certain frequency range and amplitude range so as to form a pattern of regions having different electrical conductivity, wherein at least some of the regions exposed with said electromagnetic radiation define at least one of circuits and passive components, such as e.g. resistors, capacitors and inductors, which are printed directly on the substrate; and curing (850) the polymeric material, thereby the polymeric material is hardened or toughened into a relatively solid layer that is electrically and/or mechanically coupled to the substrate.

The workpiece manufactured by the above proposed method may be a printed circuit board or a workpiece used for photovoltaic applications.

According to certain aspects of the technology disclosed, a system for manufacturing a workpiece is proposed where the mounting tool for mounting electronic components on the layer of polymeric material is omitted, said system is defined by the following units for manufacturing a workpiece (100):

a coater, such as a spray coater or spin coater, configured for providing (810) a layer (120) of a polymeric material on at least a major portion of a surface of a substrate (110), said polymeric material being adapted to change its electrical conductivity when exposed with electromagnetic radiation (E) within a certain frequency range and certain amplitude range;

a patterning tool, such as a photo mask writing tool or direct write tool, configured for patterning (830) the layer of polymeric material by exposing the layer with electromagnetic radiation having a frequency and amplitude within said certain frequency range and amplitude range so as to form a pattern of regions having different electrical conductivity, wherein at least some of the regions exposed with said electromagnetic radiation define at least one of circuits and passive components, such as e.g. resistors, capacitors and inductors, which are printed directly on the substrate; and a curing tool, such as e.g. a reflow oven, electron beam generator, microwave unit or ultraviolet light unit, for curing (850) the polymeric material, thereby the polymeric material is hardened or toughened into a relatively solid layer that is electrically and/or mechanically coupled to the substrate.

The workpiece manufactured by the above proposed system may be a printed circuit board or a workpiece used for photovoltaic applications.

It will be appreciated that other embodiments than those described above are also possible. It will also be appreciated that any of the features in the embodiments described above for the method according to the first aspect of the present invention may be combined with the workpiece according to the second aspect of the present invention. Further objectives of, features of, and advantages with the present invention will become apparent when studying the following detailed disclosure, the drawings and the appended claims. Those skilled in the art will realize that different features of the present invention can be combined to create embodiments other than those described in the following.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings, in which.

All the figures are schematic, not necessarily to scale, and generally only show parts which are necessary in order to elucidate the embodiments of the present invention, wherein other parts may be omitted or merely suggested.

DETAILED DESCRIPTION

The present invention will now be described more fully hereinafter with reference to the accompanying drawings, in which exemplifying embodiments of the present invention are shown. The present invention may, however, be embodied in many different forms and should not be construed as limited to the embodiments set forth herein; rather, these embodiments are provided by way of example so that this disclosure will convey the scope of the invention to those skilled in the art. Furthermore, like numbers refer to the same or similar elements or components throughout.

Figure 1:
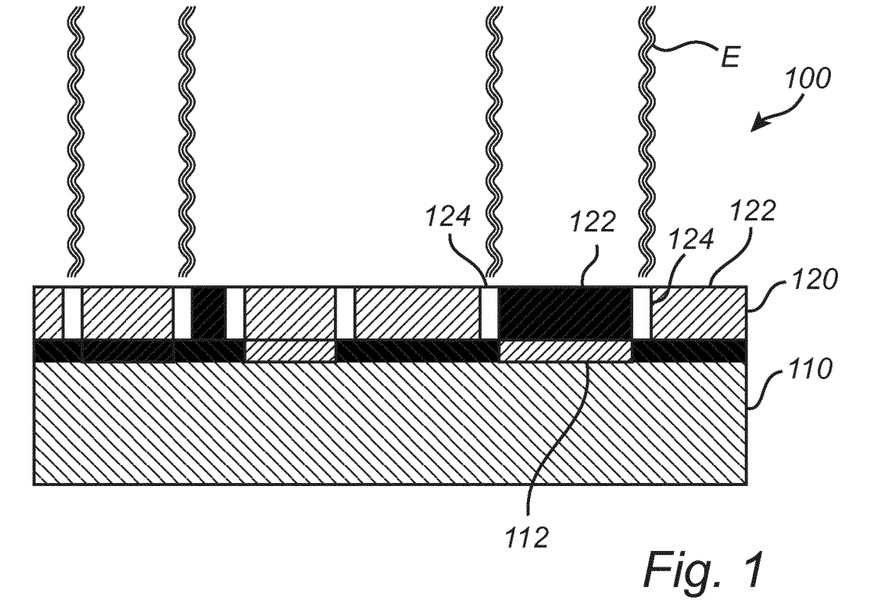
FIG. 1 schematically depicts a cross sectional side view of a workpiece according to an embodiment of the present invention, comprising a substrate and a patterned layer of polymeric material.

With reference to FIG. 1, there is shown a cross sectional side view of a workpiece 100 comprising a substrate 110 with and a layer 120 of polymeric material according to an embodiment of the present invention. The layer 120 of polymeric material is provided on at least a portion of the substrate 110 and exposed by electromagnetic radiation, which is indicated by laser rays E in FIG. 1, so as to form a pattern of regions 122 having a first conductivity and regions 124 having a second conductivity. As shown in the present figure, the regions 124 having a second conductivity may be defined or generated by the exposure to the electromagnetic radiation E, whereas regions 122 of the layer 120 that are not exposed to the electromagnetic radiation E may be maintained in a state having the first conductivity.

The substrate 120 may, according to the present embodiment, comprise electrically conductive structures such as e.g. conductive pads 112 for electrical connection of e.g. electrical components (not shown in FIG. 1). The substrate 110 may in one example be printed wire board comprising e.g. FR-4 glass epoxy.

The layer 120 of polymeric material may e.g. comprise 3,4-ethylenedioxythiophene (PEDOT) and may be provided to at least partly cover at least the pads 112 of the substrate 110. It might be advantageous to use a layer 120 of polymeric material that covers at least half the surface of the substrate 110, and preferably substantially the entire surface of the substrate 110. An electrical connection or path may be defined by regions 124 having a second conductivity, which in the present embodiment may be non-conductive so as to electrically separate the regions 122 having the first conductivity, i.e., regions being conductive. In the present example, conductive regions 122 may be provided above the pads 112 of the substrate 110 and defined by non-conductive regions 124 arranged at a periphery or perimeter of the pads 112. The layer 120 of polymeric material may hence comprise a pattern of conductive regions 122 adapted to provide an electrical connection to the pads 112. The conductive regions 122 may be used in subsequent processing steps for mechanical and/or electrical connection of e.g. electrical components to the substrate 110.

It will be appreciated that the workpiece 100 depicted in FIG. 1 may relate to any substrate comprising a layer with electrically conductive and non-conductive regions. The substrate may e.g. form part of a photovoltaic application, window pane or visual display. Further, the layer of polymeric material may be used for providing printed circuits, wherein the conductive and non-conductive regions of the pattern may define circuits and electronic components, such as e.g. resistors, capacitors and inductors, which may be printed directly on the substrate.

FIGS. 2a-2d show cross sectional side views of a workpiece 100 at different phases of a manufacturing process according to an embodiment of the present invention. The workpiece 100 may be similarly configured as the workpiece described with reference to FIG. 1.

Figure 2A:
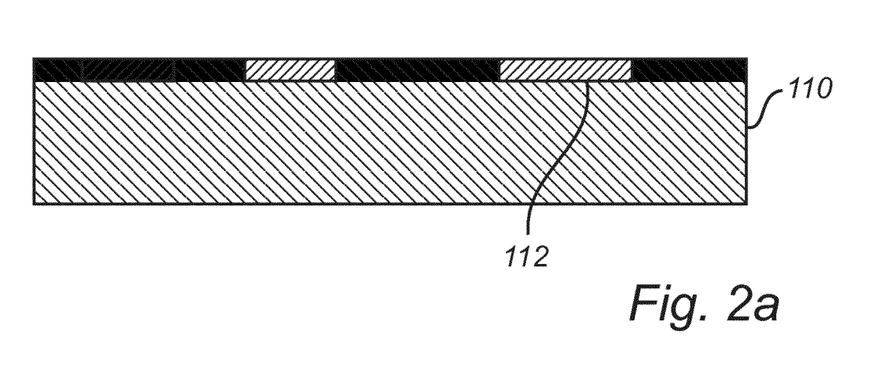
FIGS. 2a-2d schematically depict cross sectional side views of a workpiece according to an embodiment of the present invention, the side views illustrating the workpiece at different stages of the manufacturing process.

FIG. 2a discloses a bare substrate, such as e.g. a printed wired board 110 having conductive pads 112 for providing an electrical connection to electronic components to be assembled.

Figure 2B:
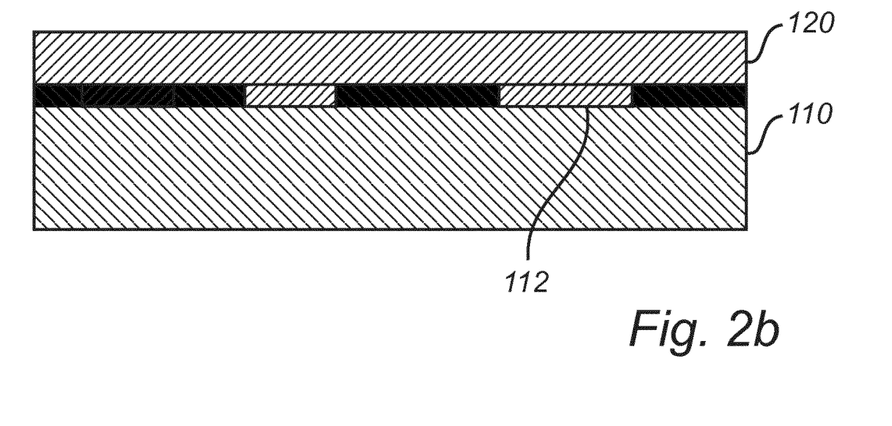

In FIG. 2b, a layer 120 of an electrically conductive polymeric material such as e.g. PEDOT has been provided. The PEDOT may e.g. be provided by means of spin coating, film deposition or spray coating. The layer 120 may have a thickness of e.g. 1 to 10.000 micrometers and may according to some embodiments be subjected to a baking step during which the polymeric material may be exposed to e.g. heat. The baking step may e.g. be performed to achieve a desired viscosity or tackiness suitable for subsequent processing steps (such as e.g. mounting of components).

Figure 2C:
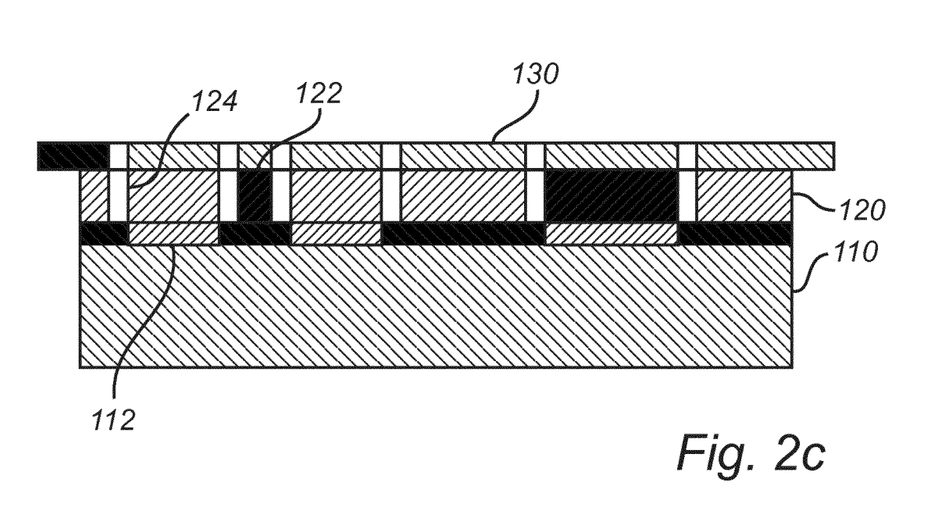

The layer 120 of polymeric material may then be provided with a pattern comprising electrically conductive regions 122 and electrically non-conductive regions 124. As shown in FIG. 2c, the conductive regions 122 may be separated with non-conductive regions 124 which may be provided by means of exposure to electromagnetic radiation. The transition of the polymeric material from a conductive state to a non-conductive state may e.g. be achieved by means of photo-oxidation of the material during exposure to UV-light during a predetermined period of time. The exposure to UV-light may induce photo-oxidation of the polymeric material, which may result in a reduction in electrical conductivity.

The exposure may e.g. be performed by means of a photo mask 130 shown in FIG. 2c, wherein the entire surface of the layer 120 of polymeric material may be exposed in a single processing step. Alternatively, or additionally direct printing or scanning techniques may be used for defining the conductive regions 122 and the non-conductive regions 124.

Figure 2D:
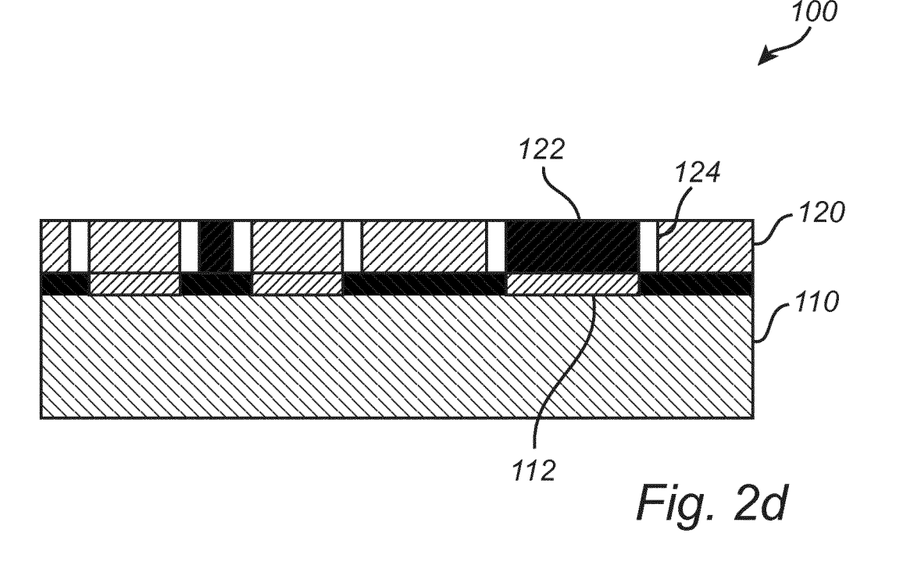

As indicated in FIG. 2d, the conductive regions 122 may provide an electrical connection to underlying contact pads 112 of the substrate 110. Electronic components may be attached to the workpiece 100 in a subsequent step, e.g. by means of a pick and place tool (not shown in FIG. 2d) positioning the components at desired positions of the workpiece 100. The layer 120 of polymeric material may have a certain stickiness or tackiness allowing the components to adhere to the substrate 110 during the processing. The components may be permanently fixated to the substrate 110 in a curing step, e.g. by using a reflow tool similar to the tool used when reflowing solder paste in surface mount technology. In other examples, the layer of polymeric material is cured by means of exposure to chemical agents, electron beams, microwaves or ultraviolet light.

Figure 3A:
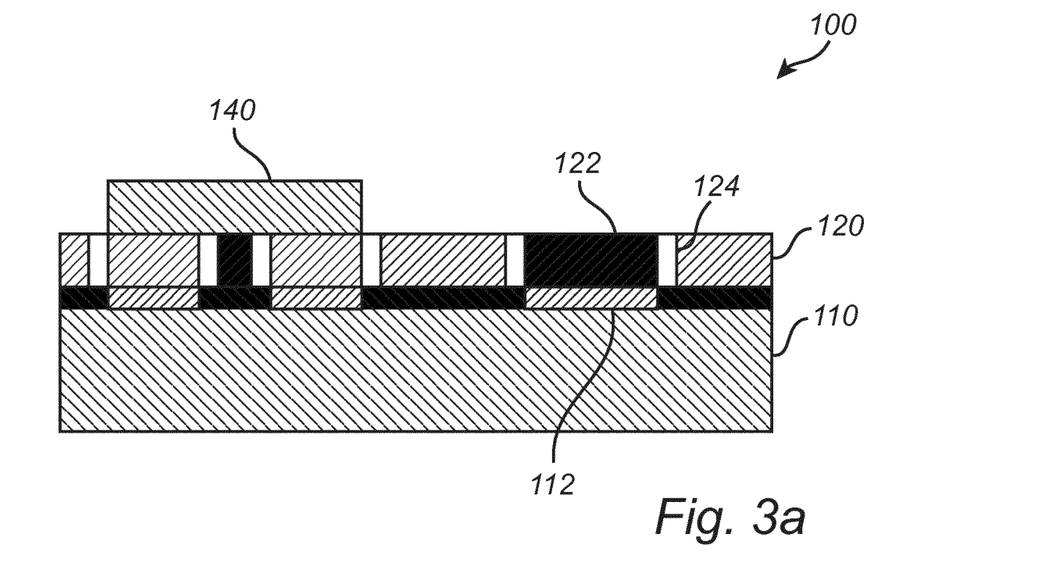
FIGS. 3a and 3b schematically depict cross sectional side view of a workpiece according to an embodiment of the present invention, the workpiece having mounted components.
Figure 3B:
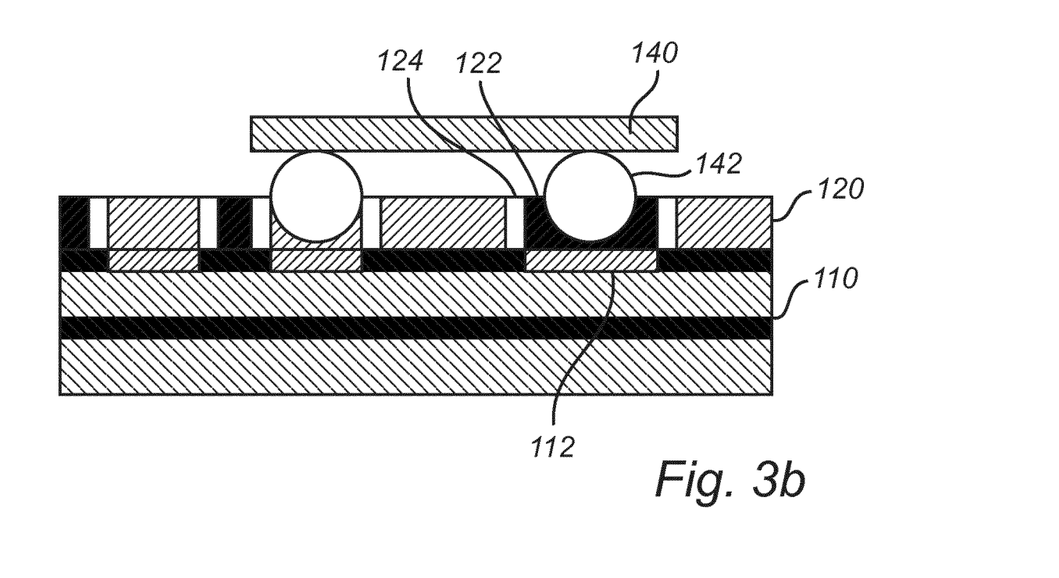

FIGS. 3a and 3b illustrates a similar workpiece as the embodiments discussed with reference to FIGS. 1 and 2a-2d. However, the workpiece 100 further comprises an assembled electronic component 140 that is attached to conductive regions 122 of the layer 120 of polymeric material. FIG. 3a discloses an electronic component, such as e.g. a resistor 140, having its contact portions directly attached to conductive regions 122 above the contact pads 112 of the substrate 110, whereas FIG. 3b discloses a component 140 that are fixated to the layer 120 of polymeric material, and thus to the contact pads 112 of the substrate 110, by means of contact legs or balls 142 that are depressed into the conductive regions 122.

Figure 4:
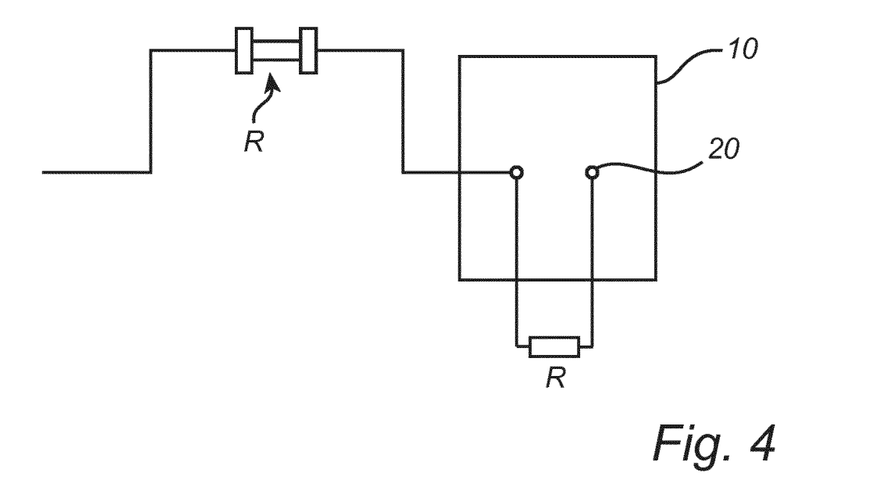
FIG. 4 schematically illustrates the layout of a prior art circuit having electrical components and separate resistors.

FIG. 4 schematically depicts a prior art technology wherein mounted components 20 are electrically connected to resistive elements, such as resistors R, that are arranged at a distance from the components 20, such as e.g. beside the substrate 10. Such a layout is associated with a relatively high footprint or required surface area, and a relatively high cost.

FIGS. 5a-5d illustrate the manufacturing of a workpiece according to an embodiment. The workpiece may be similarly configured as the embodiments described with reference to FIGS. 1 to 3b.

Figure 5A:
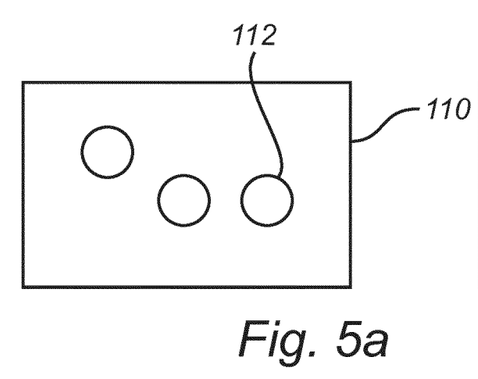
FIGS. 5a-5d and 6a-6d schematically depict top views of workpieces at different stages of manufacturing processes according to embodiments of the present invention.
Figure 5B:
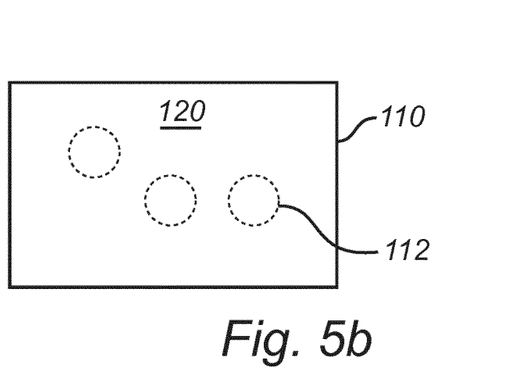
Figure 5C:
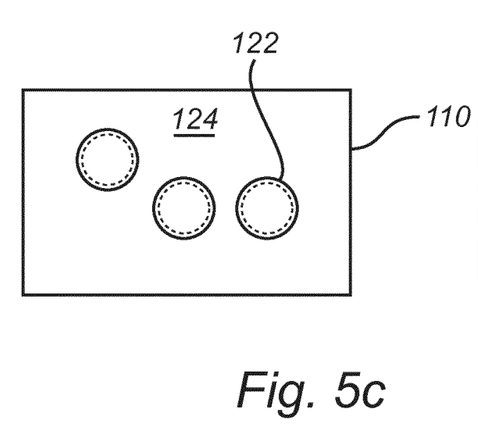
Figure 5D:
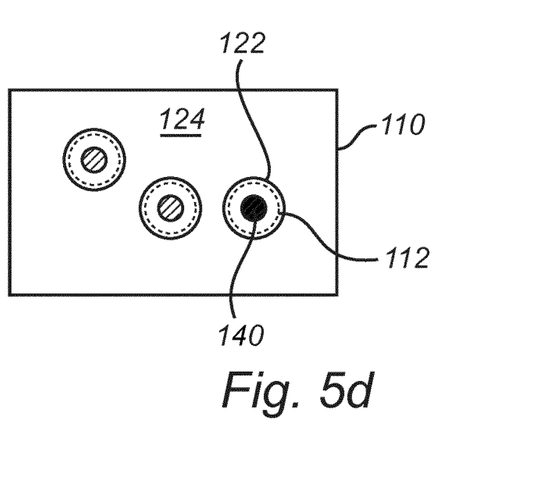

FIG. 5a is a top view of a substrate 110, such as e.g. a printed wiring board, comprising a plurality of contact pads 112. The substrate 110 may be provided with a layer 120 of polymeric material, such as e.g. PEDOT, as indicated in FIG. 5b. The polymeric material may e.g. be provided by spray coating or spin coating. In a subsequent step the layer 120 of polymeric material may be exposed so as to form a pattern of regions having different electrical conductivity (FIG. 5c). The regions may e.g. be non-conductive 124 and conductive 122, wherein the conductive regions 122 may be arranged at the contact pads 112 so as to allow for the substrate 110 to be electrically contacted by electronic components 140 (FIG. 5d).

Alternatively, or additionally, the layer 120 of polymeric material may comprise further regions provided with a certain electrical resistivity. Such regions may e.g. be used for providing electronic devices or functionalities that are integrated or direct printed in the layer 120 of polymeric material. In one example, which will be described in the following, the layer 120 of polymeric material may comprise a conductive region, a non-conductive region and a region having an electrical conductivity between the non-conductive region and the conductive region. The conductivity may e.g. be determined by the exposure of the layer, wherein a longer exposure time or a higher exposure intensity (in case electromagnetic radiation is used) may result in a reduced conductivity. In certain aspects of the technology disclosed, the conductivity is determined in a plurality of exposures of a plurality of patterning steps, e.g. a double-exposure/patterning process where a first and second conductivity is determined by a first exposure to electromagnetic radiation and a third conductivity is determined in a second patterning step. Both the first and second patterning steps for exposing the substrate with electromagnetic radiation may expose substantially the entire surface of a substrate, where the first conductivity may represent non-conductive regions, the second conductivity may be an intermediate conductivity acting as resistors and the third conductivity may represent conductive tracks for conducting a current in the manufactured workpiece.

FIGS. 6a-6d depict a workpiece that may be similarly configured as the embodiments discussed with reference to FIGS. 1-3b and 5a-5d.

Figure 6A:
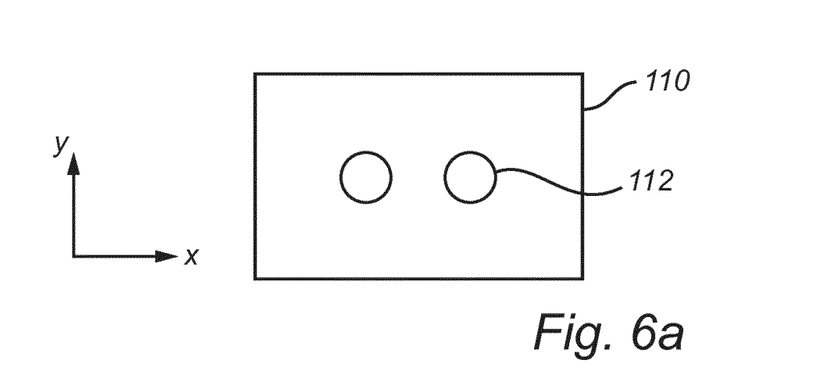
Figure 6B:
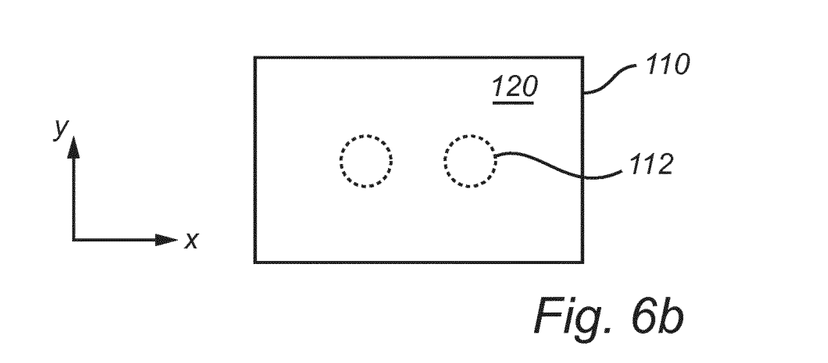
Figure 6C:
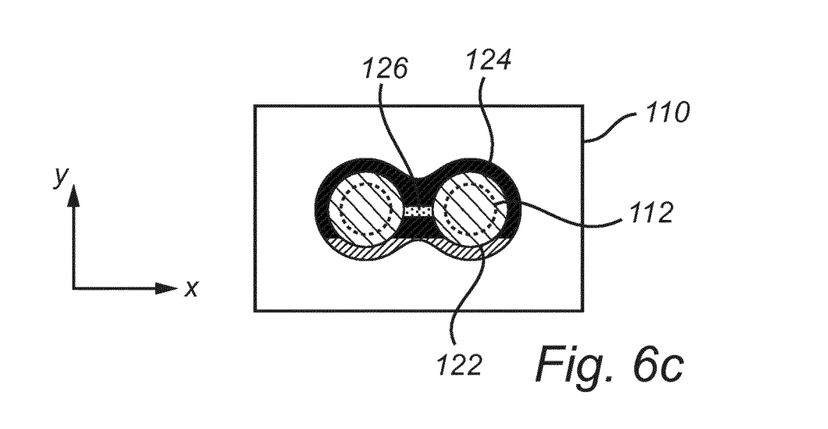
Figure 6D:
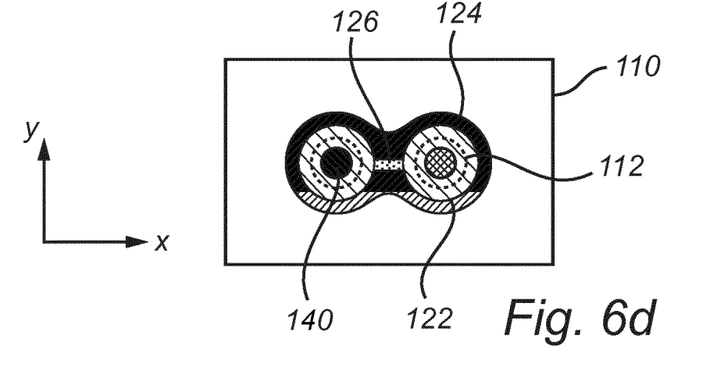

FIGS. 6a and 6b disclose a substrate 110 having e.g. two contact pads 112 and a layer 120 of polymeric material. As shown in FIG. 6c, the layer 120 of polymeric material may be patterned with regions defining a non-conductive area 124, conductive areas 122 and an area 126 having a conductivity there between. The conductive areas 122 may be arranged at the contact pads 112, respectively, and electrically connected through the area 126 having the intermediate conductivity. The area 126 with the intermediate conductivity may in other words act as a resistor electrically arranged between the contact pads 112. As the components 140 are mounted to the substrate 110, an electric current is hence allowed to pass between the components via a resistive area 126 having a main current path in a plane parallel to the layer 120 of polymeric material. By using the area 126 between two components 140 as an electronic device, such as e.g. a resistor, circuit size may be reduced.

FIGS. 7a-7d show cross sectional side views of a workpiece according to an embodiment similarly configured as the embodiments described with reference to FIGS. 1-3b, 5a-5d and 6a-6d.

Figure 7A:
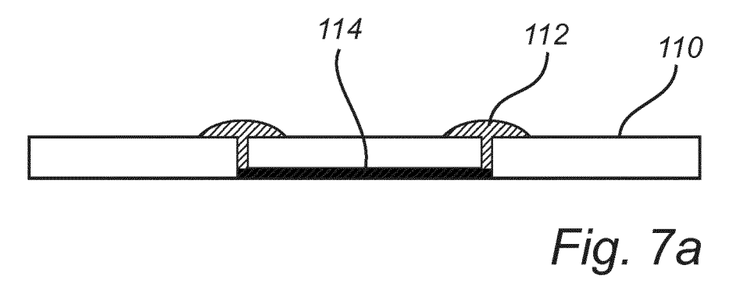
FIGS. 7a-7d schematically depict cross sectional side views of a workpiece according to an embodiment of the present invention, the side views illustrating the workpiece at different stages of the manufacturing process.
Figure 7B:
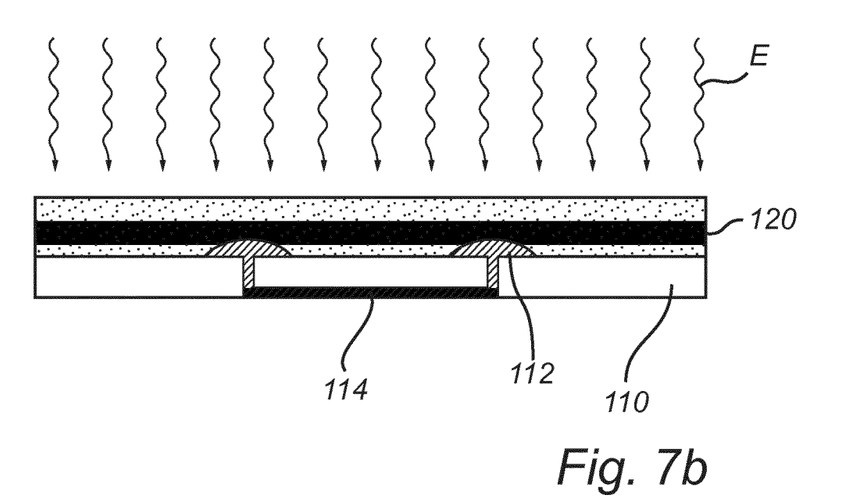
Figure 7C:
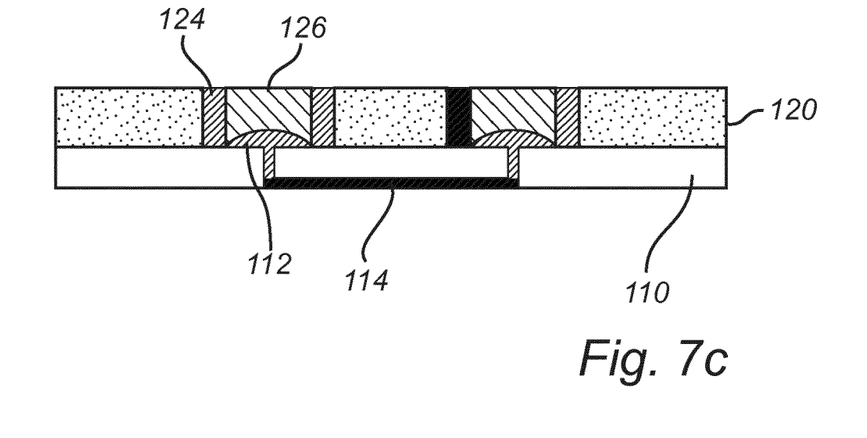
Figure 7D:
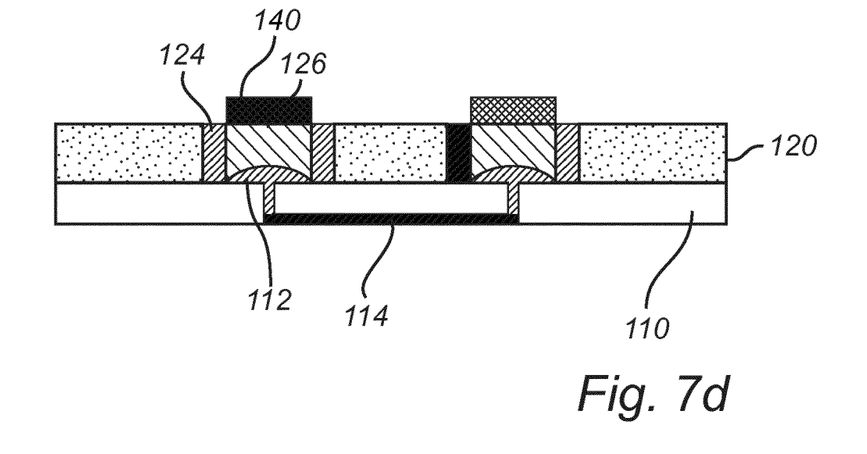

The workpiece may comprise a substrate 110 having two contact pads 112 that are interconnected by means of a conductive line 114. A layer 120 of polymeric material may be provided by e.g. spin coating, film deposition or spray coating and patterned by means of electromagnetic radiation (FIG. 7b). The pattern may e.g. comprise non-conductive areas 124 defining two vias or contact regions 126 in the layer 120 of polymeric material above the contact pads 112, respectively (FIG. 7c). The contact regions 126 may be provided with an intermediate conductivity between the conductivity of the non-conductive areas 124 and the conductive areas 122 of the layer 120 of polymeric material. The contact regions 126 may hence act a resistor arranged between the mounted component 140 (FIG. 7d) and the contact pad 112, wherein a main current path of such a resistor may be orthogonal to the layer 120 of polymeric material. In other words, a resistor may be provided between the component 140 and the contact pad 112 so as to e.g. save space and allow for circuits having a reduced area.

Figure 8:
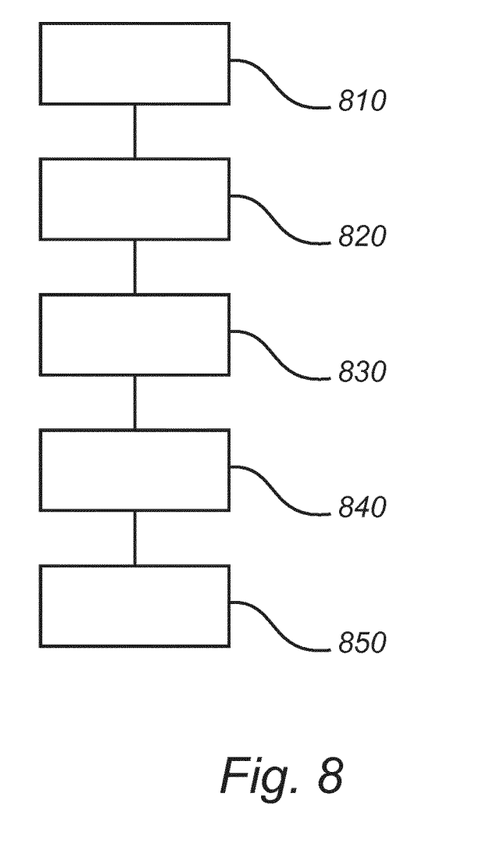
FIG. 8 schematically illustrates a method for manufacturing a workpiece that may be similarly configured as the embodiments described with reference to FIGS. 1-3b and 5a-7d.

FIG. 8 schematically illustrates a method for manufacturing a workpiece that may be similarly configured as the embodiments described with reference to FIGS. 1-3b and 5a-7d.

The method may comprise the steps of providing 810 a layer of a polymeric material on at least a portion of a substrate, baking 820 the polymeric material so as to provide a desired hardness and/or tackiness, patterning 830 the layer of polymeric material by exposing the layer with electromagnetic radiation so as to form a pattern of regions having different electrical conductivity, mounting 840 electronic components to the layer of polymeric material, and curing 850 the polymeric material so as to fixedly secure the electronic components to the substrate.

In conclusion, a workpiece and a method for manufacturing such a workpiece is disclosed. The workpiece comprises a substrate, a layer of a polymeric material and an electronic component, wherein the layer of polymeric material is adapted, in a non-cured state, to change its electrical conductivity when exposed with electromagnetic radiation within a certain frequency and amplitude range. The layer of polymeric material thus comprises a pattern of regions having a first electrical conductivity and regions having a second electrical conductivity, and is adapted to attach the electronic component to the substrate.

While the present invention has been illustrated and described in detail in the appended drawings and the foregoing description, such illustration and description are to be considered illustrative or exemplifying and not restrictive; the present invention is not limited to the disclosed embodiments. Other variations to the disclosed embodiments can be understood and effected by those skilled in the art in practicing the claimed invention, from a study of the drawings, the disclosure, and the appended claims. The mere fact that certain measures are recited in mutually different dependent claims does not indicate that a combination of these measures cannot be used to advantage. Any reference signs in the claims should not be construed as limiting the scope.

The invention claimed is:

1. A method for manufacturing a workpiece, comprising:
   providing a layer of a polymeric material on at least a portion of a substrate, said polymeric material being adapted to change its electrical conductivity when exposed with electromagnetic radiation within a certain frequency range and certain amplitude range;
   patterning the layer of polymeric material by exposing the layer with electromagnetic radiation having a frequency and amplitude within said certain frequency range and amplitude range so as to form a pattern of regions having a first electrical conductivity and regions having a second electrical conductivity;
   mounting an electronic component on the layer of polymeric material; and
   curing the polymeric material.

2. The method according to claim 1, further comprising a step of baking the polymeric material so as to provide a desired hardness and/or tackiness of the layer.

3. The method according to claim 1, wherein the regions having a first electrical conductivity are electrically separated from each other by regions having a second electrical conductivity.

4. The method according to claim 1, wherein the regions having a first conductivity are formed so as to provide electrical connection between the electronic component and a conductive pad of the substrate.

5. The method according to claim 1, wherein the polymeric material comprises a certain tackiness allowing the mounted component to adhere to the substrate during manufacturing.

6. The method according to claim 1, wherein the step of patterning the layer of polymeric material is performed by means of a photo mask.

7. The method according to claim 1, wherein the step of patterning the layer of polymeric material comprises exposing at least 50% of a total surface area of the layer of polymeric material at the same time.

8. The method according to claim 1, wherein the step of patterning the layer of polymeric material comprises direct printing.

9. The method according to claim 1, further comprising a step of forming an electronic device on the substrate, the electronic device being defined by regions having mutually different electrical conductivity.

10. The method according to claim 9, wherein the electronic device comprises a main current path extending in a same plane as the layer of polymeric material.

11. The method according to claim 1, wherein at least some of the regions exposed with said electromagnetic radiation to have mutually different conductivity define circuits and passive components in form of at least one of resistors, capacitors and inductors, which are thereby printed directly on the substrate.

12. The method according to claim 1, wherein the layer of polymeric material is cured by means of exposure to heat, electron beams, ultra violet light or chemical additives.

13. The method according to claim 1, wherein the layer of polymeric material is cured by cross-linking polymer chains of the polymeric material.

14. The method according to claim 1, wherein the substrate is a printed wiring board and the workpiece a printed circuit board assembly.

15. The method according to claim 1, wherein the polymeric material is viscous when provided on the substrate.

16. The method according to claim 1, wherein the layer of polymeric material is provided by means of spray coating of said polymeric material.

17. A method for manufacturing a workpiece, comprising:
   providing a layer of a polymeric material on at least a portion of a substrate, said polymeric material being adapted to change its electrical conductivity when exposed with electromagnetic radiation within a certain frequency range and certain amplitude range;
   patterning the layer of polymeric material by exposing the layer with electromagnetic radiation having a frequency and amplitude within said certain frequency range and amplitude range so as to form a pattern of regions having different electrical conductivity, wherein at least some of the regions exposed with said electromagnetic radiation define at least one of circuits and passive components, such as e.g. resistors, capacitors and inductors, which are printed directly on the substrate; and
   curing the polymeric material, thereby the polymeric material is hardened or toughened into a relatively solid layer that is electrically and/or mechanically coupled to the substrate.

18. The method of claim 17, wherein the polymeric material is a conductive polymer that is optically transparent, such as e.g. 3,4-ethylenedioxythiophene (PEDOT), or any derivative thereof.

19. The method of claim 18, wherein said polymeric material is an optically transparent material that is adapted for the manufacturing of a workpiece used for display applications or the manufacturing of solar cells.

* * * * *